(12) United States Patent
Vice

(10) Patent No.: US 9,246,447 B2
(45) Date of Patent: Jan. 26, 2016

(54) MULTIPATH POWER AMPLIFIER DEVICE WITH LOW POWER PATH ISOLATION

(71) Applicant: Avago Technologies General IP (Singapore) Pte. Ltd., Singapore (SG)

(72) Inventor: Michael Wendell Vice, El Granada, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 144 days.

(21) Appl. No.: 13/853,578

(22) Filed: Mar. 29, 2013

(65) Prior Publication Data
US 2014/0292414 A1    Oct. 2, 2014

(51) Int. Cl.
*H03F 3/68* (2006.01)
*H03F 3/21* (2006.01)
*H03F 1/02* (2006.01)
*H03F 1/56* (2006.01)

(52) U.S. Cl.
CPC .............. *H03F 3/211* (2013.01); *H03F 1/0277* (2013.01); *H03F 1/56* (2013.01)

(58) Field of Classification Search
CPC ........................................................ H03F 3/602
USPC ......................................... 330/51, 124 R, 295
See application file for complete search history.

(56) References Cited

U.S. PATENT DOCUMENTS

| | | | |
|---|---|---|---|
| 7,030,691 B2* | 4/2006 | Kim ................................ 330/51 |
| 7,102,444 B2* | 9/2006 | Shanjani et al. ............... 330/295 |
| 7,486,134 B2 | 2/2009 | Chang et al. |
| 8,279,010 B2* | 10/2012 | Seki et al. ...................... 330/295 |
| 8,324,964 B2* | 12/2012 | Retz et al. ....................... 330/51 |
| 2007/0080750 A1 | 4/2007 | Liebenrood |
| 2007/0222508 A1 | 9/2007 | Hau |

FOREIGN PATENT DOCUMENTS

EP    2169823 A1    3/2010

OTHER PUBLICATIONS

Andrei Grebennikov et al., "High-Efficiency Balanced Switched-Path Monolithic SiGe HBT Power Amplifiers for Wireless Applications", Proceedings of the 10th European Conference on Wireless Technology, Oct. 2007, Munich Germany, pp. 391-394.

* cited by examiner

*Primary Examiner* — Khanh V Nguyen
*Assistant Examiner* — Khiem Nguyen

(57) ABSTRACT

A multipath power amplifier device, configured to operate in a high power mode and a low power mode, includes a high power path, a low power path and an output switch. The high power path includes a high power mode (HPM) amplifying circuit for amplifying an input signal in the high power mode. The low power path includes a low power mode (LPM) amplifying circuit for amplifying the input signal in the low power mode. The output switch is configured to isolate the low power path from the high power path in the high power mode.

19 Claims, 5 Drawing Sheets

MULTIPATH POWER AMPLIFIER DEVICE WITH LOW POWER PATH ISOLATION

BACKGROUND

Conventional cellular telephone architectures must accommodate a wide range of path loss between a cellular handset (user equipment) and a servicing base station, depending on various factors, such as proximity to the base station, radio frequency (RF) obstructions, weather, and the like. As a result, RF power output required from the handset varies widely. A common characteristic of RF power amplifiers handsets, for example, is that they achieve maximum DC to RF power conversion efficiency at the upper limit of power output capability. As the RF power is reduced below this point, efficiency drops, in most cases, dramatically. Since the specific case path loss is usually less than its maximum value, the handset power amplifier is often at reduced power levels where the efficiency is compromised, which may waste battery energy beyond what is theoretically necessary. As handset technology matures in terms of sophistication and functionality, there is an increasing need to conserve battery energy at all points, including the power amplifier.

Conventional design approaches that address the need for greater efficiency in the power amplifier include envelope tracking (ET), average power tracking (APT), multiple mode, and multipath power amplifiers, for example. ET and APT involve adaptation of the power amplifier power supply voltage in a way that conforms with output power demand, so that energy is conserved. Multiple mode power amplifiers allow operating point current in the power amplifier transistors to be optimized for each of several different output power ranges. Multipath power amplifiers have partially separated RF paths for each of several different output power ranges.

Generally, a multipath power amplifier has a high power path and a low power path. FIG. 1 is a simplified block diagram showing an example of a conventional multipath power amplifier. Referring to FIG. 1, multipath power amplifier device 100 includes high power path 110 and low power path 130. The high power path 110 includes first coupling network 111, high power amplifier 112 and output matching network 113 connected in series between input port 101 and output port 102. The high power path 110 is a complete amplifier capable of producing the highest output power demanded of the application. The low power path 120 includes all or part of a second power amplifier, which is designed for lower output power. The low power path 130 includes second coupling network 131, low power amplifier 132, third coupling network 133, and the output matching network 113 connected in series between the input port 101 and the output port 102.

The low power amplifier 132 is coupled into the system using any of a number of possible passive and active coupling networks that allow it to access the input port 101 and the output port 102 of the multipath power amplifier device 100. FIG. 1 is an example that shows the low power path 130 sharing the output matching network 113 with the high power path 110. Input power of the input signal is coupled to the low power amplifier 132 through the second coupling network 131, and output power is coupled into the output matching network 113 through the third coupling network 133. The third coupling network 133 is typically an additional output matching network that transforms the load into impedance higher than the impedance presented to the high power amplifier 112, thus allowing the low power amplifier 132 to operate at lower output power while maintaining high efficiency.

Depending on the power level required, one of the high power amplifier 112 or the low power amplifier 132 will be biased On, and the other of the high power amplifier 112 or the low power amplifier 132 will be biased Off. Since the low power amplifier 132 is optimized for low power, it is highly efficient at low power levels at which the high power amplifier 132 would be very energy wasteful. Thus, conventional multipath power amplifiers, such as the multipath power amplifier device 100, generally offer higher efficiency at low power levels than traditional single path power amplifiers, all else being equal.

However, the high and low power paths 110 and 120 are coupled together at all times. An optimal alignment would present an ideal load condition to high power amplifier 112 when it is in use (On), and present a separate ideal load condition to low power amplifier 132 when it is in use, thus achieving maximum possible efficiency in each state. In conventional systems, however, this is not possible because the third coupling network 133 acts to detune the load impedance to high power amplifier 112 in the high power state. Stated differently, the optimal tuning of the third coupling network 133 for maximizing efficiency in the low power state is not tolerated in the high power state. This is because the third coupling network 133 and the low power amplifier 132 load the high power amplifier 112 differently, depending on whether the low power amplifier 132 is biased On or Off. The best practical alignment requires a compromise that leaves either or both high and low power operating states at sub-optimal performance. Generally, performance of such conventional multipath power amplifiers is worse in each of the high and low power states than counterpart single path power amplifiers. In addition, design and bench tuning are complicated by the tight interaction between the high power path 110 and low power path 130. As a result, the design optimization process is recursive and highly iterative in nature.

A similar problem can occur at the input port 101, where the input load impedance of each of the high power path 110 and low power path 130 depends on whether the corresponding high power amplifier 112 and low power amplifier 132 is biased On or Off. When the high and low power paths 110 and 130 are coupled together at the common input port 101, the input impedance depends on which state is enabled. Thus, it is difficult to achieve uniform input impedance across both (all) states of the multipath power amplifier device 100.

SUMMARY

In a representative embodiment, a multipath power amplifier device is configured to operate in a high power mode and a low power mode. The device includes a high power path comprising at least one high power mode (HPM) amplifying circuit for amplifying an input signal in the high power mode, a low power path comprising a low power mode (LPM) amplifying circuit for amplifying the input signal in the low power mode, and an output switch configured to isolate the low power path from the high power path in the high power mode.

In another representative embodiment, a multipath power amplifier device for amplifying an input signal received at an input port includes a high power path for amplifying the input signal in a high power mode, a low power path for amplifying the input signal in a low power mode, and an output switch. The high power path includes a high power mode (HPM) amplifying circuit connected to the input port, and an output matching network connected in series between an output of the HPM amplifying circuit and an output port of the device, and configured to match load impedance of a load connected to the output port to a desired impedance to be presented to the output of the HPM amplifying circuit in the high power mode. The low power path includes a low power mode (LPM) amplifying circuit connected to the input port, and an LPM output matching circuit connected in series between an output of the LPM amplifying circuit and the output of the HPM amplifying circuit, and configured to transform up an impedance seen at the output of the HPM amplifying circuit to a desired higher impedance to be presented to the LPM amplifying circuit. The output switch is configured to isolate the low power path from the high power path in the high power mode by effectively providing an open circuit in a portion of the LPM output matching circuit.

In another representative embodiment, an output switch compatible with bipolar junction transistors (BJT) technology is provided. The switch includes a first transistor having a collector connected to an RF input port, an emitter connected to ground, and a base connected to a first switch node; a second transistor having an emitter connected to the RF port, a collector connected to ground, and a base connected to a second switch node; a capacitor connected between the first and second switch nodes, such that the base of the first transistor and the base of the second transistor are connected to one another via the capacitor; a first resistor connected between the first switch node and a control port; a second resistor connected between the second switch node and the control port; and an inductor connected between the RF input port and ground in parallel with the first and second transistors.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

According to various embodiments, a multipath power amplifier device includes a high power path that is operational in a high power mode, a low power path that is operational in a low power mode, and one or more switches that provide isolation (or decoupling) between the high power path and the low power path during the high power mode. This allows optimal load impedances to be simultaneously achieved for each of the high and low power paths. These load impedances can be arrived at with a non-recursive design methodology. In addition, the desired input impedance can be achieved for all states (high and low power modes) simultaneously.

Figure 1:
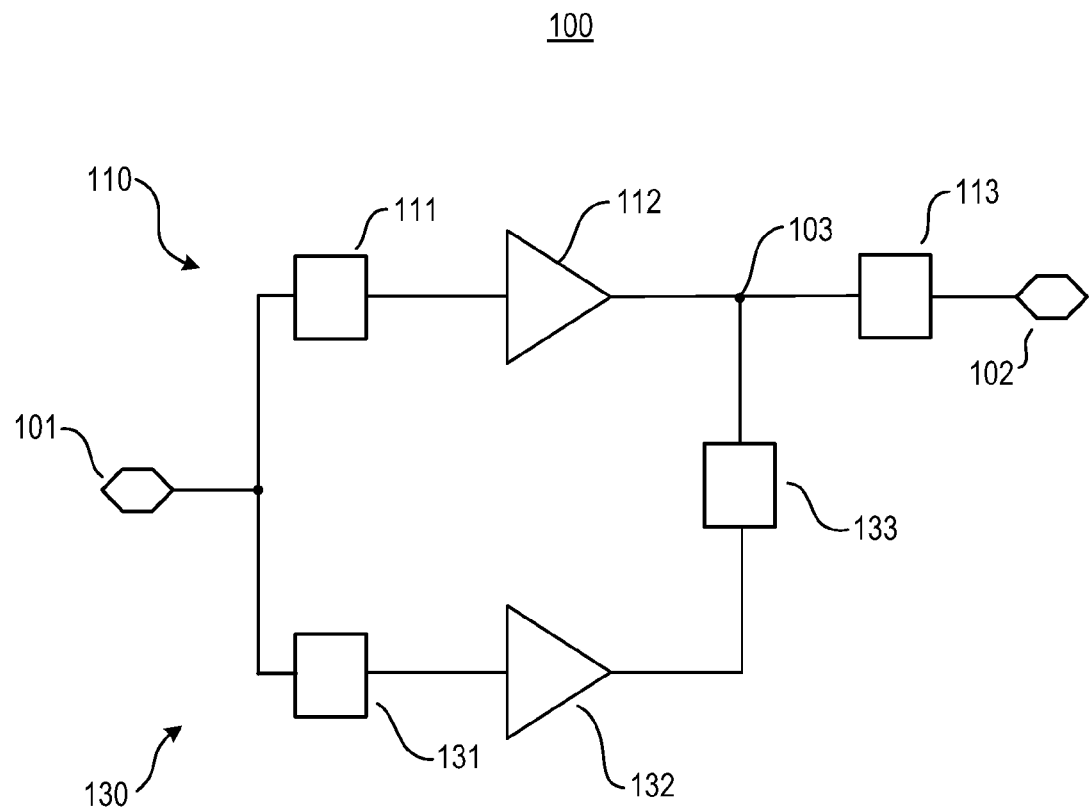
FIG. 1 is a simplified block diagram illustrating an example of a conventional multipath power amplifier.
Figure 2:
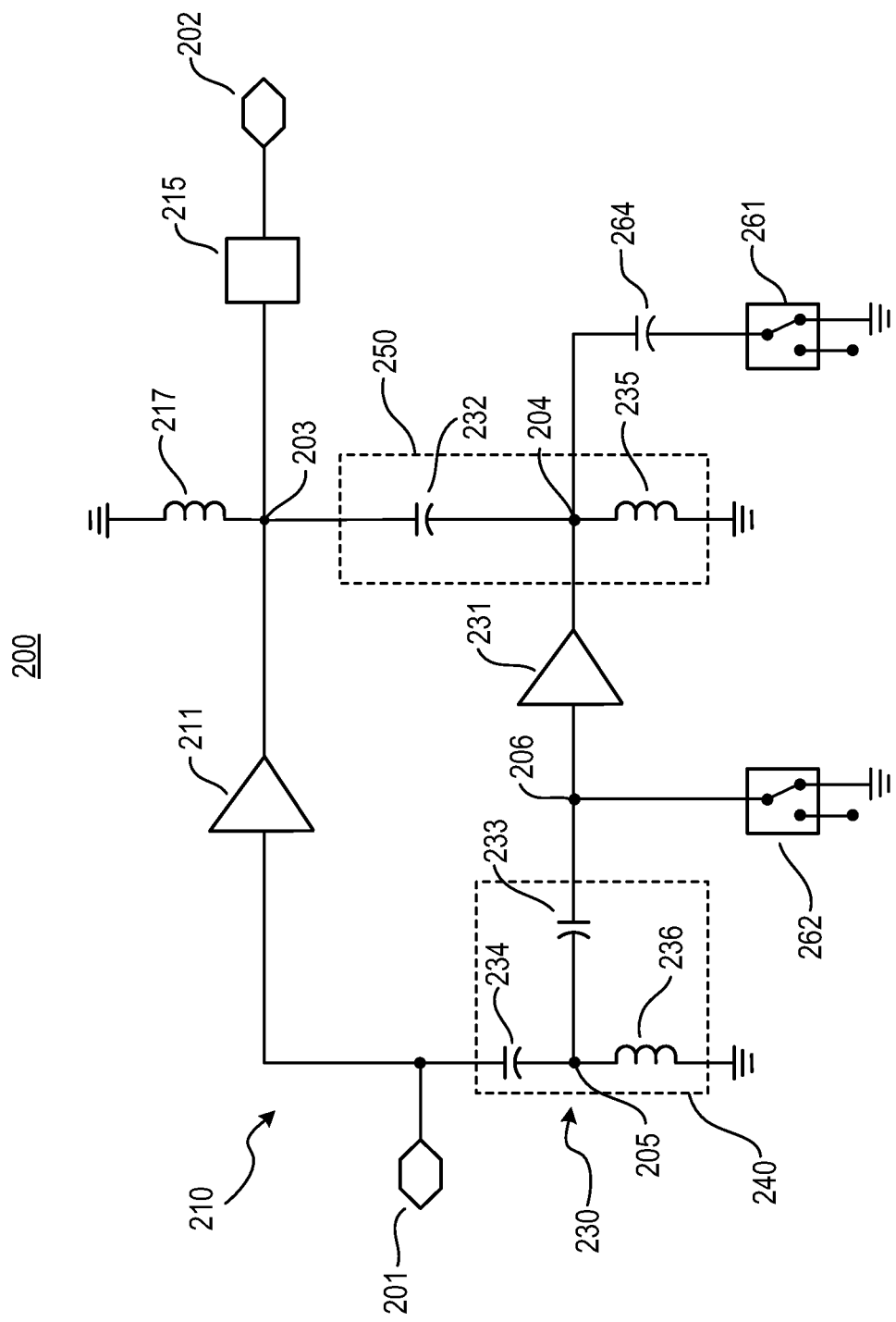
FIG. 2 is a simplified block diagram illustrating a multipath power amplifier, according to a representative embodiment.

FIG. 2 is a simplified block diagram illustrating a multipath power amplifier device, according to a representative embodiment.

Referring to FIG. 2, multipath power amplifier device 200 includes high power path 210 and low power path 230. The high power path 210 includes a high power mode (HPM) amplifying circuit 211, which may be a single stage or multiple stage high power amplifier. For example, the HPM amplifying circuit 211 may be a two stage high power amplifier that includes an input stage HPM amplifying transistor and an output stage HPM amplifying transistor connected in series (with an inter-stage matching network connected therebetween). The number of stages of the HPM amplifying circuit 211 may vary, without departing from the scope of the present teachings, where the last transistor in series may be referred to as an output stage HPM amplifying transistor. When the high power path 210 includes a single stage amplifying transistor, then the single HPM amplifying transistor also serves as the output stage HPM amplifying transistor. The high power path 210 further includes output matching network 215 connected in series with the HPM amplifying circuit 211 between input port 201 and output port 202. The output matching network 215 is configured to match load impedance of a load connected to the output port 202 to a desired impedance to be presented to an output of the HPM amplifying circuit 211 (e.g., of the output stage HPM amplifying transistor) in the high power mode.

Bias voltage is provided to the HPM amplifying circuit 211 through a bias network, which is connected to the collector or drain of the HPM output stage amplifying transistor. For example, when the HPM amplifying circuit 211 includes one or more bipolar junction transistors (BJTs), collector bias voltage is provided, and when the HPM amplifying circuit 211 includes one or more field effect transistors (FETs), drain bias voltage is provided. In the depicted embodiment, the bias network includes HPM inductor 217, which is configured to collector bias or drain bias the HPM amplifying circuit 211. Notably, in the illustrative configuration of FIG. 2, the HPM inductor 217 is shown connected between AC ground and first node 203 (HPM output node) (located between the HPM amplifying circuit 211 and the output matching network 215). For clarity, the DC bias configuration of the multipath power amplifier device 200 is not described herein, although it is understood that the multipath power amplifier device 200 requires DC bias to operate, as would be apparent to one of ordinary skill in the art. For instance, the grounded side of the HPM inductor 217 may alternatively be connected to a source of DC power, and it is understood that the source of DC power also provides a substantial short to ground at AC frequencies of operation of the amplifier device 200. The components of the high power path 210 form a representative complete amplifier for amplifying an input signal in the high power mode.

The low power path 230 includes a low power mode (LPM) amplifying circuit 231, which may be a single stage or multiple stage low power amplifier. For example, the LPM amplifying circuit 231 may be a single stage low power amplifier that includes an LPM amplifying transistor. The number of stages of the low power amplifier may vary, without departing from the scope of the present teachings, where the last transistor in series may be referred to as an output stage LPM amplifying transistor. The LPM amplifying circuit 231 will typically have fewer stages than the HPM amplifying circuit 211 since the low power path 230 typically requires less gain than the high power path 210. The low power path 230 further includes an LPM input matching circuit 240, an LPM output matching circuit 250, and the HPM output matching network 215 connected in series with the LPM amplifying circuit 231 between the input port 201 and the output port 202.

The LPM output matching circuit 250 includes first capacitor 232 connected between the first node 203 and a second node 204 (located at an output of the LPM amplifying circuit 231), and a first LPM inductor 235 connected between the second node 204 and AC ground. The first LPM inductor 235 may alternatively be connected to a source of DC power, and it is understood that the source of DC power also provides a substantial short to ground at AC frequencies of operation of the amplifier device 200. The first LPM inductor 235 operates advantageously as both a tuning element to AC ground and simultaneously as means of coupling DC bias to the LPM amplifying transistor 231. The required output impedance is produced by the LPM output matching circuit 250 to transform up the impedance seen at the output of the HPM amplifying circuit 211 to a desired higher impedance to be presented to the output of the LPM amplifying circuit 231 in the low power mode. The first LPM inductor 235 further serves as a bias choke for the LPM amplifying circuit 231. The LPM input matching circuit 240 includes third capacitor 234 connected between the input port 201 and third node 205 (LPM input node), a second LPM inductor 236 connected between the third node 205 and ground, and a second capacitor 233 (series coupling capacitor) connected between the third node 205 and an input of the LPM amplifying circuit 231. The LPM input matching circuit 240 is configured to match the input impedance of the low power path 230 with the input impedance at the input port 201 in the low power mode.

The low power path 230 also includes two switches: output (first) switch 261 and input (second) switch 262. The output switch 261 is connected in series with a switch capacitor 264 between the second node 204 and ground. The input switch 262 is connected between a fourth node 206 (located between the second capacitor 233 and the LPM amplifying circuit 231) and ground.

In low power mode, the output switch 261 is Off (open/disconnected from ground), and in high power mode, the output switch 261 is On (closed/connected to ground), which connects the switch capacitor 264 in parallel with the first LPM inductor 235. The value of the switch capacitor 264 is chosen so that the switch capacitor 264 substantially resonates with the first LPM inductor 235 when the output switch 261 is On, causing a substantially open circuit in a portion of the LPM output matching circuit 250. In this state, the first capacitor 232 provides substantially no admittance to the HPM amplifying circuit 211, e.g., at the HPM output amplifying transistor, reducing (and ideally eliminating) perturbation to alignment of the high power path 210. The output switch 261 thereby isolates (decouples) the low power path 230 from the high power path 210 in the high power mode. In an ideal circuit, the switch capacitor 264 would achieve resonance that provides a completely open circuit and zero admittance. However, in practical application, the resonance may be adjusted to provide high resistance, short of an open circuit, and a low level of admittance sufficient to reduce perturbation to a desired level.

In the low power mode, the input switch 262 is also Off (open/disconnected from ground), and in the high power mode, the input switch 262 is On (closed/connected to ground), which connects the second capacitor 233 in parallel with the second LPM inductor 236. The value of the second capacitor 233 is chosen so that the second capacitor 233 substantially resonates with the second LPM inductor 236 when the input switch 262 is On, isolating (decoupling) the low power path 230 input from the high power path 210 input during operation of the multipath power amplifier device 200 in high power mode. This isolating makes it possible to achieve the desired input impedance regardless of whether the multipath power amplifier device 200 is in the low power mode or the high power mode. That is, the input switch 262 enables matching of input impedance at the input port 201 to input impedance of the high power path 210 in the high power mode and to input impedance of the low power path 230 in the low power mode.

Generally, according to various embodiments, the base/gate bias is turned off for the transistors in the high power path 210 (e.g., in HPM amplifying circuit 211) or for the transistors in the low power path 230 (e.g., in LPM amplifying circuit 231) that is not in use, so that the unused one of the high power path 210 or the low power path 230 does not consume current, thus conserving battery energy. In comparison, many conventional multipath amplifiers operate with all signal path biases on in high power mode.

Figure 3:
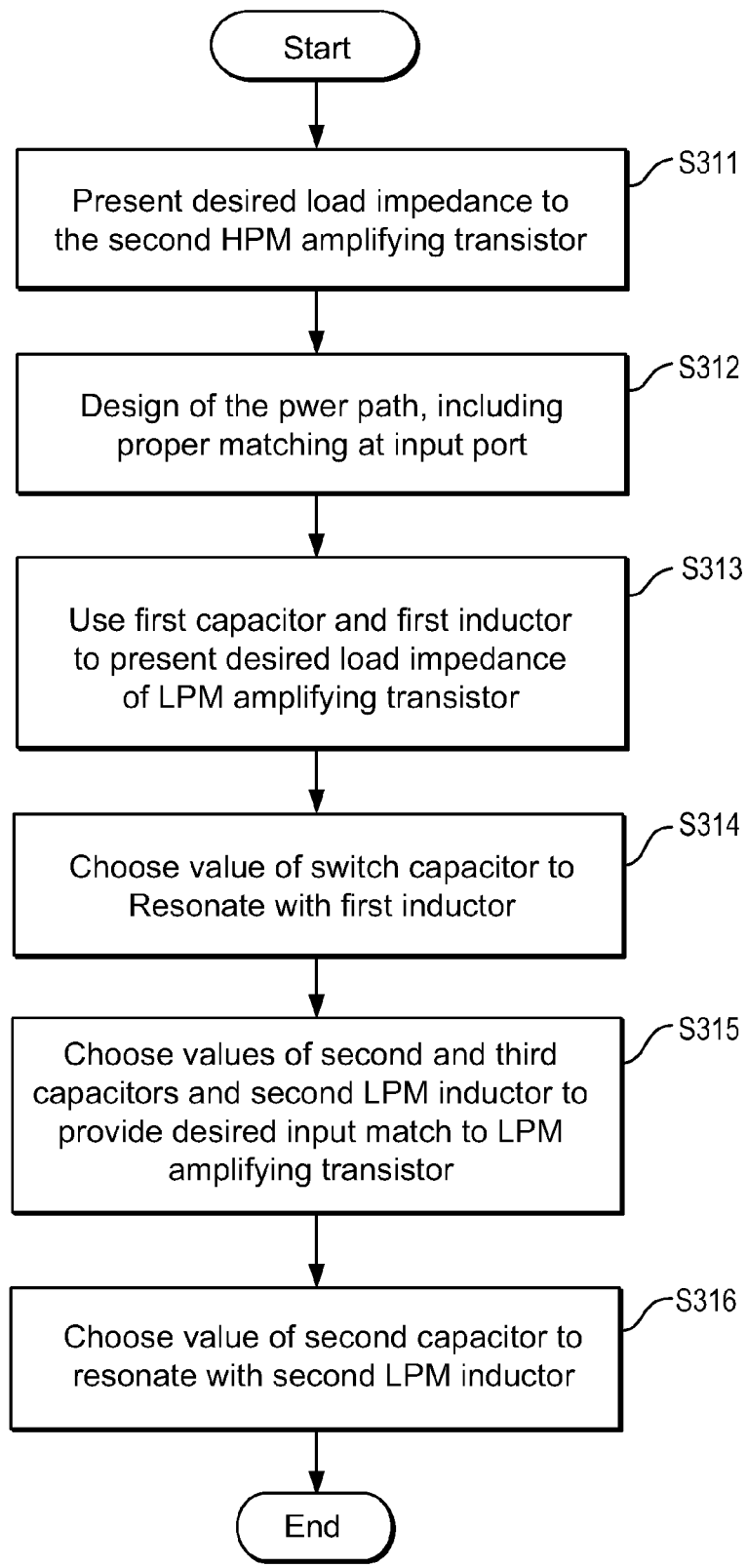
FIG. 3 is a flow diagram illustrating a method of designing the multipath power amplifier, according to a representative embodiment.

Appropriate values of the various components of the multipath power amplifier device 200 must be identified in the design stage in order to provide proper operation of the multipath power amplifier, although the interdependencies of the components makes this difficult unless a well chosen design flow is used. FIG. 3 is a flow diagram illustrating a method of designing the multipath power amplifier, according to a representative embodiment, which provides a useful and non-recursive design flow.

Referring to FIG. 3, the output matching network 215 is designed first in block S311 to present the desired load impedance to the HPM amplifying circuit 211 of the high power amplifier. The design of the high power path 210 is completed in block S312, including proper matching at the input port 201. Up to this point in the design flow, no components of the low power path 230 have been incorporated into the design, except the HPM output matching network 215, which is shared by the high power path 210.

In block S313, the first capacitor 232 and the first LPM inductor 235 are used as an impedance transformer to present the desired load impedance to the LPM amplifying circuit 231 of the low power path 230. The value of the switch capacitor 264 is chosen in block S314 so that the switch capacitor 264 resonates with the first LPM inductor 235, neutralizing the admittance of the first capacitor 232 as seen by the output stage HPM amplifying transistor of the HPM amplifying circuit 211. The values of the third capacitor 234, the second capacitor 233, and the second LPM inductor 236 are chosen in block S315 to provide the desired input match to the LPM amplifying circuit 231. In block S316, the value of the second capacitor 233 is also chosen further so that the second capacitor 233 resonates with the second LPM inductor 236, neutralizing the admittance of the third capacitor 234 as seen by the input port 201. As mentioned above, the high power path 210 typically requires more gain than the low power path 230, and therefore the high power path 210 may include more stages than the low power path 230, for example.

The output switch 261 and the input switch 262 may be formed by various types of transistors, such as bipolar junction transistors (BJTs), field effect transistors (FETs), including gallium arsenide FETs (GaAs FETs), metal-oxide semiconductor FETs (MOSFETs) or heterostructure FETs (HFETs), high electron mobility transistors (HEMTs), pseudomorphic HEMTs (pHEMTs), or the like. Generally, it is desirable to realize the output switch 261 and the input switch 262 using the same transistor technology (e.g., BJT or FET) as other transistors in the multipath power amplifier 200, e.g., to achieve maximum integration. However, BJT technology is not typically used for switches. Accordingly, illustrative structures of the output switch 261 and the input switch 262 using BJTs are provided below, according to the representative embodiments.

Figure 4:
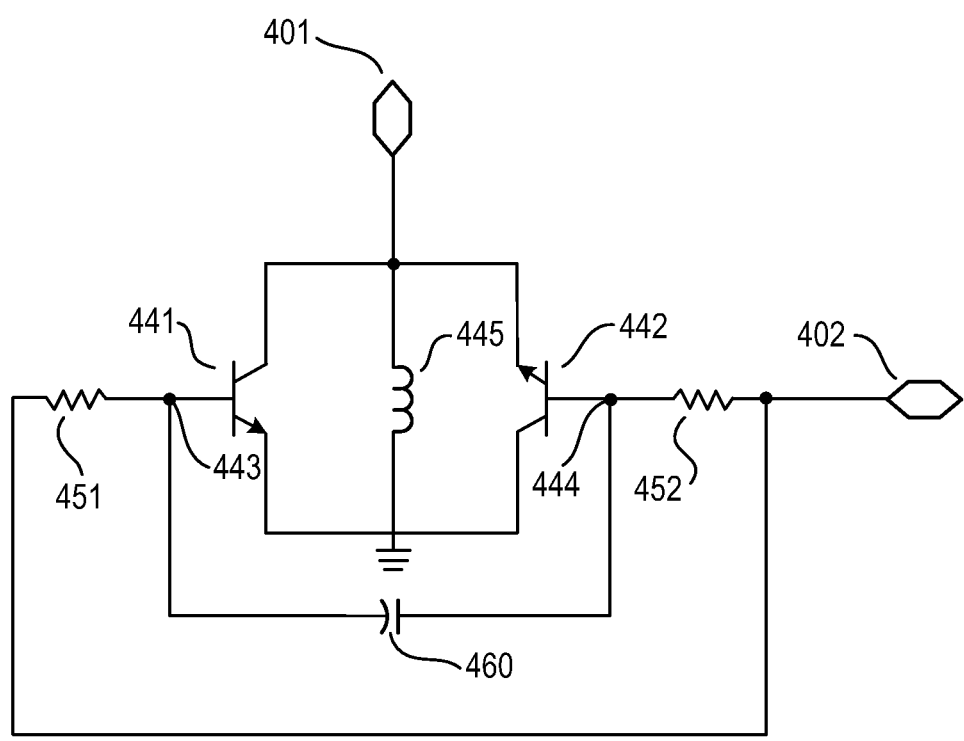
FIG. 4 is a simplified circuit diagram illustrating an output switch of a low power path of the multipath power amplifier, according to a representative embodiment.
Figure 5:
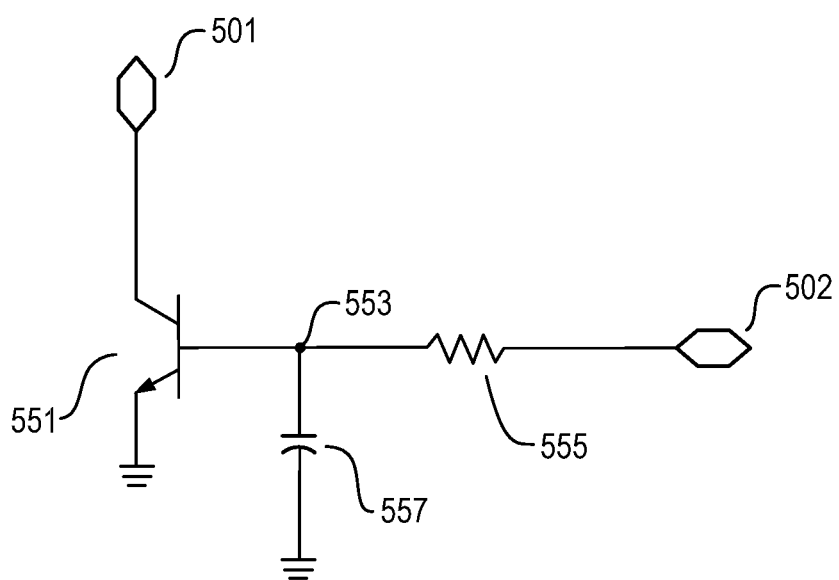
FIG. 5 is a simplified circuit diagram illustrating an input switch of a low power path of the multipath power amplifier, according to a representative embodiment.

FIG. 4 is a simplified circuit diagram illustrating an example of a switch using BJT technology that may be used as the output switch 261 in the low power path 230, and FIG. 5 is a simplified circuit diagram illustrating an example of a switch using BJT technology that may be used as the input switch 262 in the low power path 230, according to representative embodiments.

Referring to FIG. 4, switch 461 would carry current between the switch capacitor 264 and the first LPM inductor 235 of the multipath power amplifier 200 during resonance (when the switch 461 is closed), in the presence of full voltage swing on the output of the HPM amplifying circuit 211 in the high power mode. The current through the switch 461 accordingly is substantial. In order to support this current without incurring excessive loss or distortion, the switch 461 incorporates a pair of anti-parallel transistors, first transistor 441 and second transistor 442.

More particularly, in the depicted embodiment, the switch 461 includes an RF input port 401, which may be connected to a source of RF signal current, and control port 402, which may be connected to a control voltage or current source. For example, the control voltage may vary between a high level, approximately equal to a battery voltage, and a low level, approximately equal to zero or ground. The voltage (or current) levels are controlled by a controller or host processor, for example, in response to power demands on the device (e.g., cellular handset) containing the power amplifier device 200. The first transistor 441 of the pair of anti-parallel transistors has a collector connected to the RF input port 401, an emitter connected to ground, and a base connected to first switch node 443. The second transistor 442 of the pair of anti-parallel transistors has an emitter connected to the RF port, a collector connected to ground, and a base connected to second switch node 444.

A capacitor 460 is connected between the first and second switch nodes 443 and 444, such that the base of the first transistor 441 and the base of the second transistor 442 are connected to one another via the capacitor 460. A first resistor 451 is connected between the first switch node 443 and the control port 402, and a second resistor 452 is connected between the second switch node 444 and the control port 402, such that the base of the first transistor 441 and the base of the second transistor 442 are also connected the control port 402 via the first resistor 451 and the second resistor 452, respectively. The first and second resistors 451 and 452 are bias resistors. A switch inductor 445 is connected between the RF input port 401 and ground. Therefore, one end of the switch inductor 445 is connected to the collector of the first transistor 441 and the emitter of the second transistor 442, while the other end of the switch inductor 445 is connected the emitter of the first transistor 441 and the collector of the second transistor 442, such that the switch inductor 445 is connected between the RF input port 401 and ground in parallel with the pair of anti-parallel transistors.

The configuration of the switch 461 enhances efficiency. For instance, when the RF input port 401 must sink current, the first transistor 441 provides the best path. When the RF input port 401 must source current during an opposite half-cycle, the second transistor 442 provides the best path. In each case, the first and second transistors 441 and 442 are biased into the triode region of operation by receiving base current via the first and second resistors 451 and 452, respectively, from an external voltage or current source at the control port 402. The capacitor 460 acts to steer current from the base of the reverse biased first transistor 441 or the second transistor 442 into the base of the forward triode region biased first transistor 441 or the second transistor 442. This current is reversing in the capacitor 460 for each half-cycle. When the switch 461 is Off, parasytic capacitance of the first and second transistors 441 and 442 is advantageously neutralized, which may be accomplished by the switch inductor 445.

In an embodiment, the switch inductor 445 may have a value of about 3.9 nH, the first resistor 451 may have a value of about 1.3 kΩ, the second resistor 452 may have a value of about 1.3 kΩ, and the capacitor 460 may have a value of about 7 pF, for example. Of course, the component values may vary to provide unique benefits for any particular situation or to meet application specific design requirements of various implementations, as would be apparent to one of ordinary skill in the art.

When the switch 461 is used as the output switch 261 in the power amplifier device 200, as in the representative embodiment, the object of the switch 461 is to selectively permit or deny the flow of RF current received at the RF input port 401 (e.g., through capacitor 264) to ground. However, in more general applications of the switch 461, the selective flow of RF current through the switch 461 may be to some destination other than ground. In such cases, the switch 461 may be advantageously adapted by replacing the grounded node (common to the emitter of the first transistor 441 and the collector of the second transistor 442) with a second RF port. The second RF port may have a resistor to ground for completing the bias path provided by the first and second resistors 451 and 452. Also, the first and second resistors 451 and 452 may be replaced with transistors or some form of current source that equivalently provides current to flow into the bases of the first and second transistors 441 and 442 and out of the corresponding collectors and emitters, as is the general requirement for turning On the switch 461.

Referring to FIG. 5, the switch 562 may be a low signal switch when used as the input switch 262, for example, which does not demand high current capability. Therefore, a single transistor switch is sufficient. More particularly, in the depicted embodiment, the switch 562 includes an RF port 501, which may be connected to a source of RF current, and control port 502, which may be connected to a control voltage or current source, as discussed above. A transistor 551 has a collector connected to the RF port 501, an emitter connected to ground, and a base connected to switch node 553. The switch 562 further includes resistor 555 connected between the switch node 553 and the control port 502, and capacitor 557 connected between the switch node 553 and ground. In an embodiment, the resistor 555 may have a value of about 5 kΩ and the capacitor 557 may have a value of about 5 pF, for example. Of course, the component values may vary to provide unique benefits for any particular situation or to meet application specific design requirements of various implementations, as would be apparent to one of ordinary skill in the art.

The multipath power amplifiers according to various embodiments remove the drawbacks inherent in conventional multipath power amplifiers, including the compromised efficiency in each of the high and low power paths, the non-constant input impedance with respect to each of the high and low power states, and the recursive and highly iterative nature of design optimization, for example.

The various components, materials, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

The invention claimed is:

1. A multipath power amplifier device configured to operate in a high power mode and a low power mode, the device comprising:
    a high power path comprising a high power mode (HPM) amplifying circuit for amplifying an input signal in the high power mode;
    a low power path comprising a low power mode (LPM) amplifying circuit for amplifying the input signal in the low power mode; and
    an output switch arranged in series with the LPM amplifying circuit and a switch capacitor, and configured to selectively connect the LPM amplifying circuit to ground via the switch capacitor, isolating the low power path from the high power path in the high power mode.

2. The device of claim 1, wherein the high power path further comprises an output matching network connected between an output of the HPM amplifying circuit and an output port of the device, and configured to match load impedance of a load connected to the output port to a desired impedance to be presented to the HPM amplifying circuit in the high power mode; and
    wherein the low power path further comprises an LPM output matching circuit connected between an output of the LPM amplifying circuit and the output of the HPM amplifying circuit, and configured to transform up an impedance seen at the output of the HPM amplifying circuit to a desired higher impedance to be presented to the output of the LPM amplifying circuit in the low power mode.

3. The device of claim 2, wherein the low power path further comprises the output matching network of the high power path connected between the LPM output matching circuit and the output port of the device, and wherein the LPM output matching circuit comprises a first capacitor connected between the output of the HPM amplifying circuit and the output of the LPM amplifying circuit, and a first LPM inductor connected to the output of the LPM amplifying circuit.

4. The device of claim 3, wherein, when the output switch selectively connects the LPM amplifying circuit to ground via the switch capacitor, the switch capacitor is arranged in a parallel configuration with the first LPM inductor in the high power mode, so that the switch capacitor substantially resonates with the first LPM inductor, effectively providing a substantially open circuit for isolating the low power path from the high power path.

5. The device of claim 4, wherein the first capacitor provides substantially no admittance to the output of the HPM amplifying circuit when the switch capacitor substantially resonates with the first LPM inductor.

6. The device of claim 4, wherein, when the output switch selectively disconnects the LPM amplifying circuit from ground, the switch capacitor is disconnected from the parallel configuration with the first LPM inductor in the low power mode.

7. The device of claim 4, wherein the first LPM inductor is connected between the output of the LPM amplifying circuit and AC ground.

8. The device of claim 7, wherein the high power path further comprises an HPM inductor connected between the output of the HPM amplifying circuit and AC ground, and configured to provide collector bias for the HPM amplifying circuit.

9. The device of claim 1, further comprising:
    an input switch configured to isolate the low power input path from the high power input path in the high power mode, enabling matching of input impedance at an input port of the device to input impedance of the high power path in the high power mode and to input impedance of the low power path in the low power mode.

10. The device of claim 9, wherein the low power path further comprises an LPM input matching circuit connected between the input port and the LPM amplifying circuit, and configured to match the input impedance of the low power path with the input impedance at the input port in the low power mode.

11. The device of claim 10, wherein the LPM input matching circuit comprises a third capacitor connected between the input port and an LPM input node and a second LPM inductor connected between the LPM input node and ground.

12. The device of claim 11, wherein the input switch is configured to selectively connect a second capacitor, connected between the LPM input node and the LPM amplifying circuit, into a parallel configuration with the second LPM inductor in the high power mode, so that the second capacitor resonates with the second LPM inductor, effectively providing an open circuit for isolating the low power path from the high power path.

13. The device of claim 12, wherein the second capacitor is configured to act as a series coupling capacitor.

14. The device of claim 1, wherein the output switch comprises:
    a pair of anti-parallel transistors connected between an input port and ground, the anti-parallel transistors comprising corresponding bases connected to a control port via first and second resistors, respectively;
    a capacitor connected between the bases of the anti-parallel transistors; and
    a switch inductor connected in parallel with the anti-parallel transistors.

15. The device of claim 9, wherein the input switch comprises:
    a transistor connected between an input port and ground, the transistor comprising a base connected to a control port via a resistor; and
    a capacitor connected between the base of the transistor and ground.

16. A multipath power amplifier device for amplifying an input signal received at an input port, the device comprising:
    a high power path for amplifying the input signal in a high power mode, the high power path comprising:
        a high power mode (HPM) amplifying circuit connected to the input port; and
        an output matching network connected in series between an output of the HPM amplifying circuit and an output port of the device, and configured to match load impedance of a load connected to the output port to a desired impedance to be presented to the output of the HPM amplifying circuit in the high power mode;

a low power path for amplifying the input signal in a low power mode, the low power path comprising:
  a low power mode (LPM) amplifying circuit connected to the input port; and
  an LPM output matching circuit connected in series between an output of the LPM amplifying circuit and the output of the HPM amplifying circuit, and configured to transform up an impedance seen at the output of the HPM amplifying circuit to a desired higher impedance to be presented to the LPM amplifying circuit; and an output switch configured to isolate the low power path from the high power path in the high power mode by effectively providing an open circuit in a portion of the LPM output matching circuit.

17. A multipath power amplifier device for amplifying an input signal received at an input port, the device comprising:
  a high power path for amplifying the input signal in a high power mode, the high power path comprising:
    a high power mode (HPM) amplifying circuit connected to the input port; and
    an output matching network connected in series between an output of the HPM amplifying circuit and an output port of the device, and configured to match load impedance of a load connected to the output port to a desired impedance to be presented to the output of the HPM amplifying circuit in the high power mode;
  a low power path for amplifying the input signal in a low power mode, the low power path comprising:
    a low power mode (LPM) amplifying circuit connected to the input port; and
    an LPM output matching circuit connected in series between an output of the LPM amplifying circuit and the output of the HPM amplifying circuit, and configured to transform up an impedance seen at the output of the HPM amplifying circuit to a desired higher impedance to be presented to the LPM amplifying circuit; and
  an output switch configured to isolate the low power path from the high power path in the high power mode by effectively providing an open circuit in a portion of the LPM output matching circuit,
  wherein the low power path further comprises the output matching network of the high power path connected between the LPM output matching circuit and the output port of the device, and wherein the LPM output matching circuit comprises a first capacitor connected between the output of the HPM amplifying circuit and the output of the LPM amplifying circuit, and a first LPM inductor connected between the output of the LPM amplifying circuit and AC ground.

18. The device of claim 17, wherein the output switch is configured to selectively connect a switch capacitor to ground in parallel with the first LPM inductor in the high power mode, so that the switch capacitor substantially resonates with the first LPM inductor to effectively provide the open circuit.

19. The device of claim 16, further comprising:
  an input switch configured to isolate the low power path from the high power path in the high power mode, enabling matching of input impedance at the input port to input impedance of the high power path in the high power mode and to input impedance of the low power path in the low power mode,
  wherein the low power path further comprises:
    a LPM input matching circuit connected in series between the input port and the LPM amplifying circuit, the input switch effectively providing an open circuit in a portion of the LPM input matching circuit in the high power mode for isolating the low power path from the high power path.

* * * * *